United States Patent
Daito et al.

(10) Patent No.: US 11,955,319 B2
(45) Date of Patent: Apr. 9, 2024

(54) PROCESSING CHAMBER WITH MULTIPLE PLASMA UNITS

(71) Applicant: Applied Materials, Inc., Santa Clara, CA (US)

(72) Inventors: Kazuya Daito, Milipitas, CA (US); Yi Xu, San Jose, CA (US); Yu Lei, Belmont, CA (US); Takashi Kuratomi, San Jose, CA (US); Jallepally Ravi, San Ramon, CA (US); Pingyan Lei, San Jose, CA (US); Dien-Yeh Wu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/844,245

(22) Filed: Jun. 20, 2022

(65) Prior Publication Data
US 2022/0319813 A1    Oct. 6, 2022

Related U.S. Application Data

(62) Division of application No. 17/101,074, filed on Nov. 23, 2020, now abandoned.
(Continued)

(51) Int. Cl.
*C23C 16/50* (2006.01)
*C23C 16/455* (2006.01)
(Continued)

(52) U.S. Cl.
CPC .. *H01J 37/32357* (2013.01); *C23C 16/45536* (2013.01); *C23C 16/50* (2013.01);
(Continued)

(58) Field of Classification Search
CPC .......... H01J 37/32357; H01J 37/32422; H01J 2237/327; H01J 2237/332;
(Continued)

(56) References Cited

U.S. PATENT DOCUMENTS 5,091,049 A    2/1992  Campbell et al.
5,710,486 A    1/1998  Ye et al.
(Continued)

FOREIGN PATENT DOCUMENTS

JP    2009238878 A    10/2009
JP    2014531753 A    11/2014
(Continued)

OTHER PUBLICATIONS

Final Office Action in U.S. Appl. No. 17/101,074, dated Oct. 27, 2022, 8 pages.
(Continued)

*Primary Examiner* — Rudy Zervigon
(74) *Attorney, Agent, or Firm* — Servilla Whitney LLC

(57) ABSTRACT

Provided is a processing chamber configured to contain a semiconductor substrate in a processing region of the chamber. The processing chamber includes a remote plasma unit and a direct plasma unit, wherein one of the remote plasma unit or the direct plasma unit generates a remote plasma and the other of the remote plasma unit or the direct plasma unit generates a direct plasma. The combination of a remote plasma unit and a direct plasma unit is used to remove, etch, clean, or treat residue on a substrate from previous processing and/or from native oxide formation. The combination of a remote plasma unit and direct plasma unit is used to deposit thin films on a substrate.

5 Claims, 3 Drawing Sheets

Related U.S. Application Data

(60) Provisional application No. 62/960,293, filed on Jan. 13, 2020, provisional application No. 62/941,148, filed on Nov. 27, 2019.

(51) Int. Cl.
  *H01J 37/32* (2006.01)
  *H01L 21/67* (2006.01)
  *H05H 1/46* (2006.01)

(52) U.S. Cl.
  CPC .. *H01J 37/32422* (2013.01); *H01L 21/67028* (2013.01); *H01L 21/67069* (2013.01); *H05H 1/4652* (2021.05); *H01J 2237/327* (2013.01); *H01J 2237/332* (2013.01); *H01J 2237/335* (2013.01)

(58) Field of Classification Search
  CPC ......... H01J 2237/335; C23C 16/45536; C23C 16/50; C23C 16/452; C23C 16/509; H01L 21/67028; H01L 21/67069; H05H 1/4652
  USPC ............... 118/723 ME, 723 ER, 723 IR; 156/345.35, 345.36; 427/569, 570, 533, 427/535, 96.8, 237, 248.1, 255.23, 427/255.28; 216/58, 67
  See application file for complete search history.

(56) References Cited

U.S. PATENT DOCUMENTS

| | | | |
|---|---|---|---|
| 6,124,003 A * | 9/2000 | Mikami | C23C 16/505 427/562 |
| 6,153,530 A | 11/2000 | Ye et al. | |
| 6,835,278 B2 | 12/2004 | Selbrede | |
| 7,294,205 B1 | 11/2007 | Ravi et al. | |
| 7,977,249 B1 | 7/2011 | Liu et al. | |
| 9,362,130 B2 | 6/2016 | Ingle et al. | |
| 9,502,218 B2 | 11/2016 | Chen et al. | |
| 10,256,079 B2 | 4/2019 | Lubomirsky et al. | |
| 10,510,553 B1 * | 12/2019 | Kuo | H01J 37/32715 |
| 11,195,696 B2 | 12/2021 | Shin et al. | |
| 2002/0029747 A1 | 3/2002 | Powell et al. | |
| 2002/0073925 A1 | 6/2002 | Noble et al. | |
| 2004/0161942 A1 | 8/2004 | Tabaru | |
| 2004/0194890 A1 | 10/2004 | Moroz | |
| 2004/0219737 A1 * | 11/2004 | Quon | H01J 37/32697 438/222 |
| 2005/0211170 A1 | 9/2005 | Hanawa et al. | |
| 2005/0211546 A1 | 9/2005 | Hanawa et al. | |
| 2007/0074814 A1 | 4/2007 | Hahn et al. | |
| 2008/0156771 A1 | 7/2008 | Jeon et al. | |
| 2008/0178805 A1 * | 7/2008 | Paterson | H01J 37/32449 118/723 R |
| 2013/0319615 A1 | 12/2013 | Cho et al. | |
| 2014/0148014 A1 | 5/2014 | You et al. | |
| 2015/0090583 A1 | 4/2015 | Kodaira et al. | |
| 2015/0118862 A1 | 4/2015 | Reilly et al. | |
| 2016/0276134 A1 | 9/2016 | Collins et al. | |
| 2016/0358784 A1 | 12/2016 | Hudson et al. | |
| 2017/0069466 A1 | 3/2017 | Tran et al. | |
| 2017/0148630 A1 | 5/2017 | Kim et al. | |
| 2017/0229290 A1 | 8/2017 | Kobayashi et al. | |
| 2019/0198301 A1 | 6/2019 | Ma et al. | |
| 2019/0318937 A1 | 10/2019 | Yang et al. | |
| 2021/0082724 A1 * | 3/2021 | Xie | H01J 37/32422 |
| 2022/0131071 A1 | 4/2022 | Lill et al. | |

FOREIGN PATENT DOCUMENTS

| | | |
|---|---|---|
| JP | 2014532988 A | 12/2014 |
| KR | 100653217 B1 | 12/2006 |

OTHER PUBLICATIONS

Non-Final Office Action in U.S. Appl. No. 17/101,074, dated Dec. 2, 2022, 12 pages.
Non-Final Office Action in U.S. Appl. No. 17/101,077, dated Oct. 27, 2022, 15 pages.
Non-Final Office Action in U.S. Appl. No. 17/101,074 dated Jan. 27, 2022, 10 pages.
PCT International Search Report and Written Opinion in PCT/US2020/061759 dated Mar. 18, 2021, 9 pages.
PCT International Search Report and Written Opinion in PCT/US2020/061763 dated Mar. 16, 2021, 9 pages.

* cited by examiner

PROCESSING CHAMBER WITH MULTIPLE PLASMA UNITS

CROSS-REFERENCE TO RELATED APPLICATIONS

This application is a Divisional of U.S. application Ser. No. 17/101,074, filed on Nov. 23, 2020, which claims priority to U.S. Provisional Application No. 62/941,148, filed Nov. 27, 2019, and to U.S. Provisional Application No. 62/960,293, filed Jan. 13, 2020, the entire disclosures of which are hereby incorporated by reference herein.

TECHNICAL FIELD

Embodiments of the disclosure generally relate to semiconductor processes and apparatus. More particularly, embodiments relate to processing apparatus and processes that include both remote and direct plasma units.

BACKGROUND

Integrated circuits are made possible by processes which produce patterned material layers on a substrate. Producing patterned material on a substrate requires controlled methods for removal of exposed material. Chemical etching is used for a variety of purposes, including transferring a pattern in photoresist into underlying layers, thinning layers, or thinning lateral dimensions of features already present on the surface. Sometimes it is necessary to have an etch process that etches one material faster than another facilitating, for example, a pattern transfer process.

Incoming substrates often have residue on them from previous processing, from native oxide formation on a metal, and etch residue from via hole formation. To improve process performance of the metal fill, e.g. low line resistance, high yield, and high reliability, any residue and/or native oxide must be removed. Remote plasma and direct plasma, alone, are incapable of removing the residue and native oxide inside the structure effectively. Remote plasma radicals do not reach the structure trench well due to its lifetime, and direct plasma does not clear the side walls of a structure due to the directionality.

Therefore, there is a need in the art for improved processes and apparatus for etching (cleaning) materials and structures on semiconductor substrates.

SUMMARY

One or more embodiments of the disclosure are directed to a processing chamber. In one or more embodiments, a processing chamber comprises: a lid and at least one sidewall defining an internal volume; a remote plasma unit in the internal volume; a direct plasma unit in the internal volume; and at least one electrode, wherein one of the remote plasma unit or the direct plasma unit generates a remote plasma and the other of the remote plasma unit or the direct plasma unit generates a direct plasma.

Additional embodiments of the disclosure are directed to a processing method. In one or more embodiments, a processing method comprises: exposing a substrate to a remote plasma and exposing a substrate to a direct plasma.

Further embodiments of the disclosure are directed to a non-transitory computer readable medium. In one or more embodiments, a non-transitory computer readable medium including instructions, that, when executed by a controller of a processing chamber, causes the processing chamber to perform operations of: exposing a substrate to a remote plasma; and exposing the substrate to a direct plasma.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the terms "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, silicon nitride, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the present disclosure relate to processing apparatus and methods relating to semiconductor processing chambers. In one or more embodiments, a processing chamber is configured to contain a semiconductor substrate in a processing region of the chamber. In one or more embodiments, the processing chamber includes a remote plasma unit and a direct plasma unit, wherein one of the remote plasma unit or the direct plasma unit generates a remote plasma and the other of the remote plasma unit or the direct plasma unit generates a direct plasma. In some embodiments, the combination of a remote plasma unit and a direct plasma unit is used to remove, treat, residue on a substrate from previous processing and/or from native oxide formation.

Figure 1A:
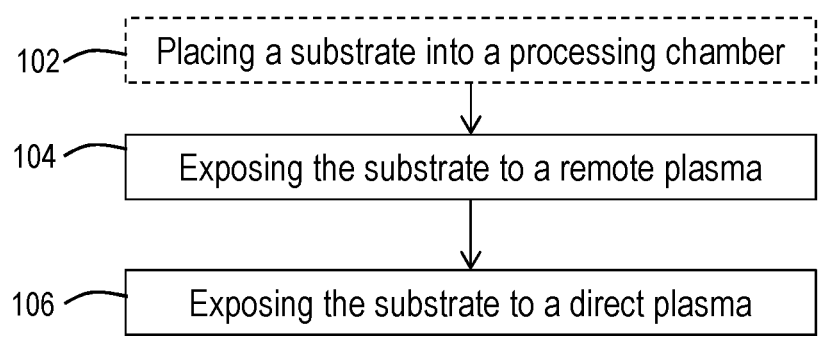
FIG. 1A illustrates a process flow diagram for a method according to one or more embodiments.

FIG. 1A illustrates a process flow diagram of a method 100 according to one or more embodiments. At operation 102, a substrate is optionally placed into a processing chamber. At operation 104, a substrate is exposed to a remote plasma. At operation 106, the substrate is exposed to a direct plasma. In one or more embodiments, exposing the substrate to the remote plasma and exposing the substrate to a direct plasma occurs sequentially. In some embodiments, the substrate is first exposed to the remote plasma and is thereafter is exposed to the direct plasma. In one or more embodiments, exposing the substrate to the remote plasma and exposing the substrate to a direct plasma occurs simultaneously.

Figure 1B:
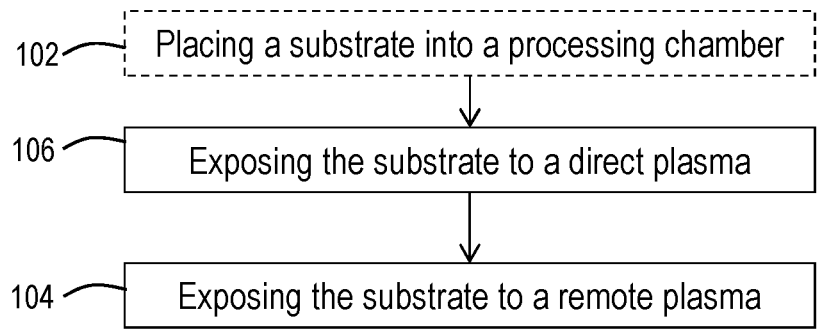
FIG. 1B illustrates a process flow diagram for a method according to one or more embodiments.

FIG. 1B illustrates a process flow diagram of a method 100 according to one or more embodiments. At operation 102, a substrate is optionally placed into a processing chamber. At operation 106, a substrate is exposed to a direct plasma. At operation 104, the substrate is exposed to a remote plasma. In one or more embodiments, exposing the substrate to the direct plasma and exposing the substrate to a remote plasma occurs sequentially. In some embodiments, the substrate is first exposed to the direct plasma and is thereafter exposed to the remote plasma. In one or more embodiments, exposing the substrate to the direct plasma and exposing the substrate to a remote plasma occurs simultaneously.

In one or more embodiments, exposing the substrate to the remote plasma and exposing the substrate to a direct plasma treats or cleans the substrate. In one or more embodiments, the substrate comprises at least one feature. The at least one feature may comprise any feature known to the skilled artisan, including, but not limited to a trench, a via, or a peak. In embodiments where exposing the substrate to a remote plasma and a direct plasma treats or cleans the substrate, the treating or cleaning removes one or more of a residue, e.g. from prior processing, and/or a native oxide. In embodiments where exposing the substrate to a direct plasma and a remote plasma treats or cleans the substrate, the treating or cleaning removes one or more of a residue, e.g. from prior processing, and/or a native oxide.

In one or more embodiments, the method further comprises exposing the substrate to at least one precursor to deposit a film on the substrate vis a vis a plasma enhanced chemical vapor deposition (PECVD) process or a plasma enhanced atomic layer deposition process (PEALD). Any appropriate precursor known to the skill artisan may be used to form a film on the substrate.

Figure 2:
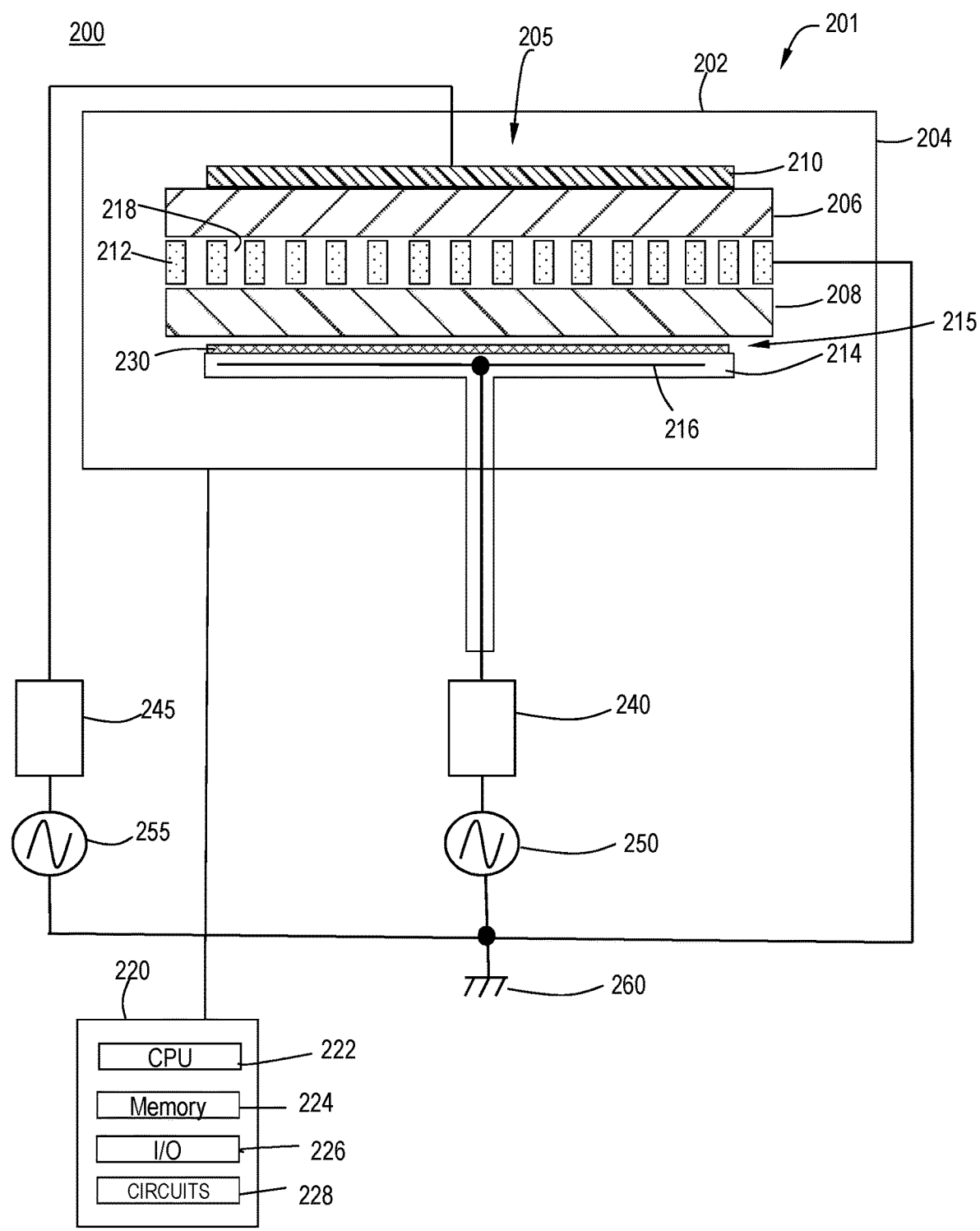
FIG. 2 illustrates schematic diagram of a processing tool according to one or more embodiments.

FIG. 2 illustrates a processing tool 200 according to one or more embodiments. In one or more embodiments, the processing tool 200 comprising a processing chamber 201. The processing chamber comprises a lid 202 and at least one side wall 204. In one or more embodiments, the lid 202 and the at least one sidewall 204 define an internal volume 205 of the processing chamber 201. In one or more embodiments, the processing tool 200 comprises a remote plasma unit 206 within the internal volume 205 of the processing chamber 201. In one or more embodiments, a direct plasma unit 208 is within the internal volume 205 of the processing chamber 201. In one or more embodiments, one of the remote plasma unit 206 generates a remote plasma and the direct plasma unit 208 generates a direct plasma. In one or more embodiments, the generation of the remote plasma and the generation of the direct plasma occurs sequentially. In some embodiments, the generation of the remote plasma occurs first, and the generation of the direct plasma occurs thereafter. In other embodiments, the generation of the direct plasma occurs first and the generation of the remote plasma occurs thereafter. In one or more embodiments, the generation of the remote plasma and the generation of the direct plasma occurs simultaneously.

In one or more embodiments, an ion filter 212 separates the remote plasma unit 206 and the direct plasma unit 208. In one or more embodiments, the ion filter 212 is used to filter ions from the plasma effluents during transit from the remote plasma unit 206 to the substrate processing region 215. In one or more embodiments, the ion filter 212 functions to reduce or eliminate ionically charged species traveling from the remote plasma unit 206 to the substrate 230. In one or more embodiments, uncharged neutral and radical species may pass through at least one aperture 218 in the ion filter 212 to react at the substrate 230. It should be noted that complete elimination of ionically charged species in the reaction region 215 surrounding the substrate 230 is not always the desired goal. In one or more embodiments, ionic species are required to reach the substrate 230 in order to perform etch and/or deposition processes. In these instances, the ion filter 212 helps control the concentration of ionic species in the reaction region 215 at a level that assists the treat/clean and/or deposition process.

In one or more embodiments, the processing tool comprises at least one electrode within the processing chamber. In one or more embodiments, the at least one electrode is located within the internal volume 205 of the processing chamber 201. In the embodiment illustrated in FIG. 2, at least one electrode 210 is positioned in electrical communication with the remote plasma unit 206.

In one or more embodiments, the processing chamber 201 comprises a pedestal 214. In one or more embodiments, the pedestal 214 is configured to support a semiconductor substrate 230 in a processing region 215. In one or more embodiments, the pedestal 214 may have a heat exchange channel (not illustrated) through which a heat exchange fluid flows to control the temperature of the substrate 230. In one or more embodiments, the substrate 230 temperature can be cooled or heated to maintain relatively low temperatures, such as from about −20° C. to about 400° C. In one or more embodiments, the heat exchange fluid comprises one or more of ethylene glycol or water. In other embodiments, the pedestal 214 is resistively heated in order to achieve relatively high temperatures, such as from about 100° C. to about 1100° C., or from about 200° C. to about 750° C., through the use of an embedded resistive heater element (not illustrated). In one or more embodiments, the pedestal 214 is configured to rotate. In one or more embodiments, the pedestal 214 comprises an electrode 216 within the interior of the pedestal 214, and the pedestal 214 is powered by RF generator 250 and matched by RF match 240. In one or more embodiments, the pedestal 214 is comprised of a metallic material and is, itself, an electrode.

In one or more embodiments, at least one power source, e.g. RF generator, 250 is electrically connected via a first RF match 240 and a second RF match 245 to the processing chamber 201.

In one or more embodiments, two RF generators 250 are electrically connected to the processing chamber 201. In such embodiments, a first RF generator 250 is electrically connected to a pedestal electrode 216, and a second RF generator 255 is electrically connected to a top electrode 210.

In one or more embodiments, a plasma is generated using a radio frequency (RF) powered remote plasma unit 206 and/or direct plasma unit 208. In one or more embodiments, alternating current (AC) power is rectified and switched to provide current to a RF amplifier. The RF amplifier operates at a reference frequency (13.56 MHz, for example), drives current through an output-matching network, and then through a power measurement circuit to the output of the power supply. The output match is usually designed to be connected a generator that is optimized to drive particular impedance, such as, for example, 50 ohms, in order to have the same characteristic impedance as the coaxial cables commonly used in the industry. Power flows through the matched cable sections, is measured by the match controller, and is transformed through the load match. The load match is usually a motorized automatic tuner, so the load match operation incurs a predetermined time delay before the system is properly configured. After passing through the load match, power is then channeled into a plasma excitation circuit that drives two electrodes in an evacuated processing chamber. A processing gas is introduced into the evacuated processing chamber, and when driven by the circuit, plasma is generated. Since the matching network or the load match is motorized, the response time from the matching network is typically on the order of one second or more.

In some embodiments, the plasma power is in a range of from about 10 W to about 1000 W, including from about 200 W to about 600 W. In some embodiments, the plasma power is less than or equal to about 1000 W, or less than or equal to about 6500 W.

The plasma frequency may be any suitable frequency. In some embodiments, the plasma has a frequency in a range of about 200 kHz to 30 MHz. In some embodiments, the plasma frequency is less than or equal to about 20 MHz, less than or equal to about 10 MHz, less than or equal to about 5 MHz, less than or equal to about 1000 kHz, or less than or equal to about 500 kHz. In some embodiments, the plasma frequency is greater than or equal to about 210 kHz, greater than or equal to about 250 kHz, greater than or equal to about 600 kHz, greater than or equal to about 750 MHz, greater than or equal to about 1200 kHz, greater than or equal to about 2 MHz, greater than or equal to about 4 MHz, greater than or equal to about 7 MHz, greater than or equal to about 12 MHz, greater than or equal to about 15 MHz, or greater than or equal to about 25 MHz. In one or more embodiments, the plasma has a frequency of about 13.56 MHz, or about 350 kHz, or about 400 kHz, or about 27 MHz, or about 40 MHz, or about 60 MHz.

In one or more embodiments, a controller 220 may be provided and coupled to various components of the processing tool 200 to control the operation thereof. The controller 220 can be a single controller that controls the entire processing tool 200, or multiple controllers that control individual portions of the processing tool 200. For example, the processing tool 200 may include separate controllers for each of the processing chamber 202, remote plasma unit 206, direct plasma unit 208, and power source 250.

In some embodiments, the processing chamber 201 further comprises a controller 220. In one or more embodiments, the controller 220 controls the ignition of the plasma by the remote plasma unit 206 and/or the direct plasma unit 208 within the processing chamber 201.

In some embodiments, the controller 220 includes a central processing unit (CPU) 222, a memory 224, inputs/outputs (I/O) 226, and support circuits 228. The controller 220 may control the processing tool 200 directly, or via computers (or controllers) associated with particular process chamber and/or support system components.

The controller 220 may be one of any form of general-purpose computer processor that can be used in an industrial setting for controlling various chambers and sub-processors. The memory 224 or computer readable medium of the controller 220 may be one or more of readily available memory such as non-transitory memory (e.g. random access memory (RAM)), read only memory (ROM), floppy disk, hard disk, optical storage media (e.g., compact disc or digital video disc), flash drive, or any other form of digital storage, local or remote. The memory 224 can retain an instruction set that is operable by the processor (CPU 222) to control parameters and components of the processing tool 200.

The support circuits 228 are coupled to the CPU 222 for supporting the processor in a conventional manner. These circuits include cache, power supplies, clock circuits, input/output circuitry and subsystems, and the like. One or more processes may be stored in the memory 224 as software routine that, when executed or invoked by the processor, causes the processor to control the operation of the processing tool 200 or individual processing units (e.g. remote plasma unit 206 and direct plasma unit 208) in the manner described herein. The software routine may also be stored and/or executed by a second CPU (not shown) that is remotely located from the hardware being controlled by the CPU 222.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 220 has one or more configurations to execute individual processes or sub-processes to perform the method. The controller 220 can be connected to and configured to operate intermediate components to perform the functions of the methods. For example, the controller 220 can be connected to and configured to control one or more of the remote plasma unit 206, the direct plasma unit 208, the pedestal 214, the at least one electrode, or other components.

Figure 3:
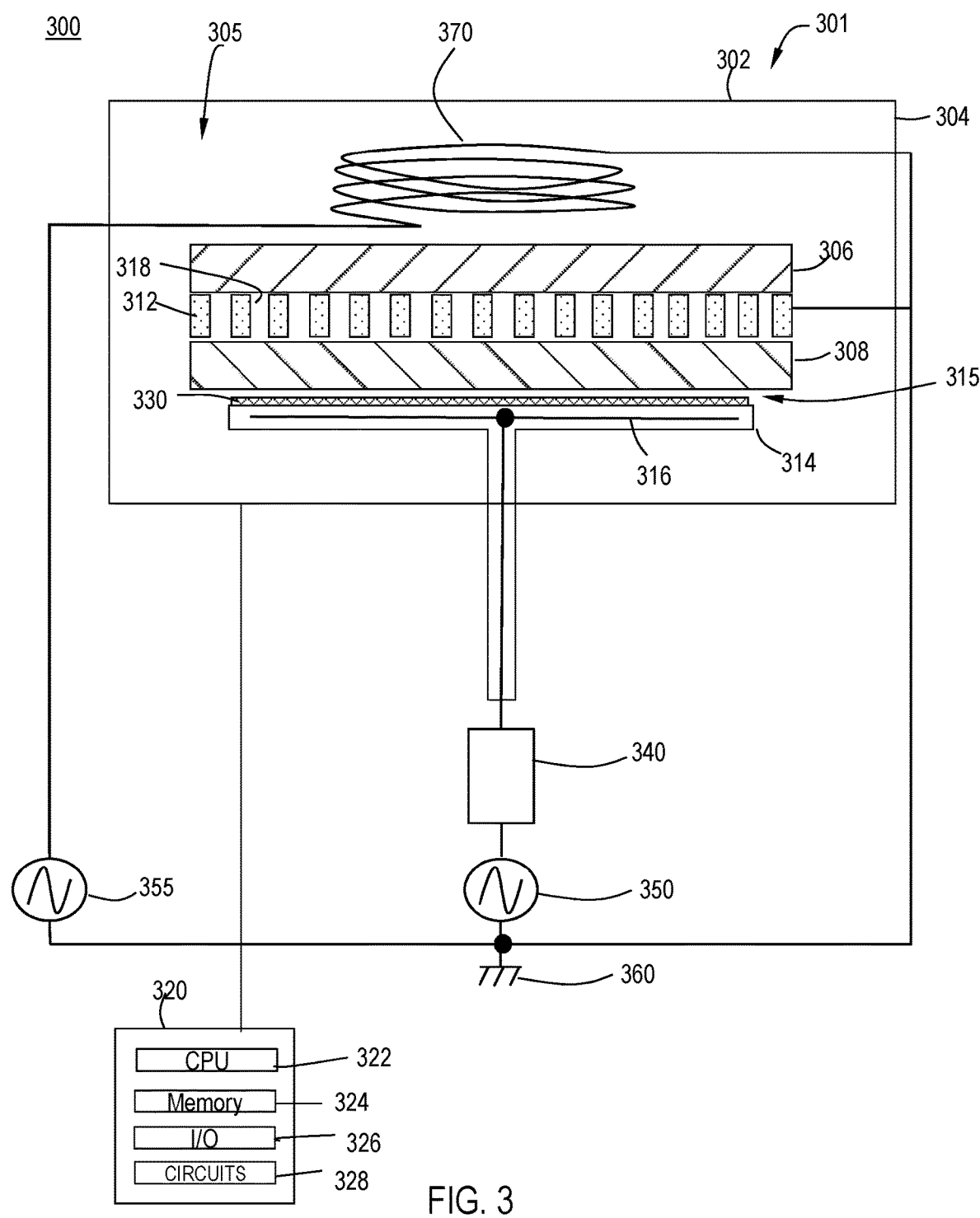
FIG. 3 illustrates schematic diagram of a processing tool according to one or more embodiments.

FIG. 3 illustrates a processing tool 300 according to one or more embodiments. In one or more embodiments, the processing tool 300 comprises a processing chamber 301. The processing chamber comprises a lid 302 and at least one side wall 304. In one or more embodiments, the lid 302 and the at least one sidewall 304 define an internal volume 305 of the processing chamber 301. In one or more embodiments, the processing tool 300 comprises a remote plasma unit 306 within the internal volume 305 of the processing chamber 301. In one or more embodiments, a direct plasma unit 308 is within the internal volume 305 of the processing chamber 301. In one or more embodiments, one of the remote plasma unit 306 generates a remote plasma and the direct plasma unit 308 generates a direct plasma. In one or more embodiments, the generation of the remote plasma and the generation of the direct plasma occurs sequentially. In some embodiments, the generation of the remote plasma occurs first, and the generation of the direct plasma occurs thereafter. In other embodiments, the generation of the direct plasma occurs first and the generation of the remote plasma occurs thereafter. In one or more embodiments, the generation of the remote plasma and the generation of the direct plasma occur simultaneously.

In one or more embodiments, an ion filter 312 separates the remote plasma unit 306 and the direct plasma unit 308. In one or more embodiments, the ion filter 312 is used to filter ions from the plasma effluents during transit from the remote plasma unit 306 to the substrate processing region 315. In one or more embodiments, the ion filter 312 functions to reduce or eliminate ionically charged species traveling from the remote plasma unit 306 to the substrate 330. In one or more embodiments, uncharged neutral and radical species may pass through at least one aperture 318 in the ion filter 312 to react at the substrate 330. It should be noted that complete elimination of ionically charged species in the reaction region 315 surrounding the substrate 330 is not always the desired goal. In one or more embodiments, ionic species are required to reach the substrate 330 in order to perform etch and/or deposition processes. In these instances, the ion filter 312 helps control the concentration of ionic species in the reaction region 315 at a level that assists the treat/clean and/or deposition process.

In one or more embodiments, the ion filter 312 comprises a showerhead.

In one or more embodiments, the processing tool comprises at least one electrode within the processing chamber. In one or more embodiments, the at least one electrode is located within the internal volume 305 of the processing chamber 301. In the embodiment illustrated in FIG. 3, at least one electrode 316 is positioned in electrical communication with the pedestal 314.

In one or more embodiments, the processing chamber 301 comprises a pedestal 314. In one or more embodiments, the pedestal 314 is configured to support a semiconductor substrate 330 in a processing region 315. In one or more embodiments, the pedestal 314 may have a heat exchange channel (not illustrated) through which a heat exchange fluid flows to control the temperature of the substrate 330. In one or more embodiments, the substrate 330 temperature can be cooled or heated to maintain relatively low temperatures, such as from about −20° C. to about 400° C., or from about 0° C. to about 400° C. In one or more embodiments, the heat exchange fluid comprises one or more of ethylene glycol or water. In other embodiments, the pedestal 314 is resistively heated in order to achieve relatively high temperatures, such as from about 100° C. to about 1100° C., or from about 200° C. to about 750° C., through the use of an embedded resistive heater element (not illustrated). In one or more embodiments, the pedestal 314 is configured to rotate. In one or more embodiments, the pedestal 314 comprises an electrode 316 within the interior of the pedestal 314, and the pedestal 314 is powered by RF generator 350 and matched by RF match 340. In one or more embodiments, the pedestal 314 is comprised of a metallic material and is, itself, an electrode.

In one or more embodiments, at least one power source, e.g. RF generator, 350 is electrically connected via an RF match 340 to the processing chamber 301.

In one or more embodiments, two RF generators are electrically connected to the processing chamber 301. In such embodiments, a first RF generator 350 is electrically connected to a pedestal electrode 316, and a second RF generator 355 is electrically connected to an inductively coupled plasma (ICP) coil 370.

In one or more embodiments, a plasma is generated using a radio frequency (RF) powered remote plasma unit 306 and direct plasma unit 308. In one or more embodiments, alternating current (AC) power is rectified and switched to provide current to a RF amplifier. The RF amplifier operates at a reference frequency (13.56 MHz, for example), drives current through an output-matching network, and then through a power measurement circuit to the output of the power supply. The output match is usually designed to be connected a generator that is optimized to drive particular impedance, such as, for example, 50 ohms, in order to have the same characteristic impedance as the coaxial cables commonly used in the industry. Power flows through the matched cable sections, is measured by the match controller, and is transformed through the load match. The load match is usually a motorized automatic tuner, so the load match operation incurs a predetermined time delay before the system is properly configured. After passing through the load match, power is then channeled into a plasma excitation circuit that drives two electrodes in an evacuated processing chamber. A processing gas is introduced into the evacuated processing chamber, and when driven by the circuit, plasma is generated. Since the matching network or the load match is motorized, the response time from the matching network is typically on the order of one second or more.

In some embodiments, the plasma power is in a range of about 10 W to about 1000 W, including from about 200 W to about 600 W. In some embodiments, the plasma power is less than or equal to about 1000 W, or less than or equal to about 6500 W.

The plasma frequency may be any suitable frequency. In some embodiments, the plasma has a frequency in a range of about 200 kHz to 30 MHz. In some embodiments, the plasma frequency is less than or equal to about 20 MHz, less than or equal to about 10 MHz, less than or equal to about 5 MHz, less than or equal to about 1000 kHz, or less than or equal to about 500 kHz. In some embodiments, the plasma frequency is greater than or equal to about 210 kHz, greater than or equal to about 250 kHz, greater than or equal to about 600 kHz, greater than or equal to about 750 MHz, greater than or equal to about 1200 kHz, greater than or equal to about 2 MHz, greater than or equal to about 4 MHz, greater than or equal to about 7 MHz, greater than or equal to about 12 MHz, greater than or equal to about 15 MHz, or greater than or equal to about 25 MHz. In one or more embodiments, the plasma has a frequency of about 13.56 MHz, or about 350 kHz, or about 400 kHz, or about 27 MHz, or about 40 MHz, or about 60 MHz.

In one or more embodiments, a controller 320 may be provided and coupled to various components of the processing tool 300 to control the operation thereof. The controller 320 can be a single controller that controls the entire processing tool 300, or multiple controllers that control individual portions of the processing tool 300. For example, the processing tool 300 may include separate controllers for each of the processing chamber 301, remote plasma unit 306, direct plasma unit 308, and power source 350.

In some embodiments, the processing chamber 301 further comprises a controller 320. In one or more embodiments, the controller 320 controls the ignition of the plasma by the remote plasma unit 306 and/or the direct plasma unit 308 within the processing chamber 301.

In some embodiments, the controller 320 includes a central processing unit (CPU) 322, a memory 324, inputs/outputs (I/O) 326, and support circuits 328. The controller 320 may control the processing tool 300 directly, or via computers (or controllers) associated with particular process chamber and/or support system components.

The controller 320 may be one of any form of general-purpose computer processor that can be used in an industrial setting for controlling various chambers and sub-processors. The memory 324 or computer readable medium of the controller 320 may be one or more of readily available memory such as non-transitory memory (e.g. random access memory (RAM)), read only memory (ROM), floppy disk, hard disk, optical storage media (e.g., compact disc or digital video disc), flash drive, or any other form of digital storage, local or remote. The memory 324 can retain an instruction set that is operable by the processor (CPU 322) to control parameters and components of the processing tool 300.

The support circuits 328 are coupled to the CPU 322 for supporting the processor in a conventional manner. These circuits include cache, power supplies, clock circuits, input/output circuitry and subsystems, and the like. One or more processes may be stored in the memory 324 as software routine that, when executed or invoked by the processor, causes the processor to control the operation of the processing tool 300 or individual processing units (e.g. remote plasma unit 306 and direct plasma unit 308) in the manner described herein. The software routine may also be stored and/or executed by a second CPU (not shown) that is remotely located from the hardware being controlled by the CPU 322.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 320 has one or more configurations to execute individual processes or sub-processes to perform the method. The controller 320 can be connected to and configured to operate intermediate components to perform the functions of the methods. For example, the controller 320 can be connected to and configured to control one or more of the remote plasma unit 306, the direct plasma unit 308, the pedestal 314, the at least one electrode 316, the ICP coil 370, or other components.

One or more embodiments are directed to a non-transitory computer readable medium including instructions, that, when executed by a controller of a processing chamber, cause the processing chamber to perform the operations of exposing a substrate to a remote plasma and exposing a substrate to a direct plasma. In one or more embodiments, the non-transitory computer readable medium includes instructions, that, when executed by the controller of the processing chamber, cause the processing chamber to perform the operation of exposing the substrate to at least one precursor to form a film on the substrate.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A processing method comprising: exposing a substrate to a remote plasma that remotely impacts the substrate and exposing the substrate to a direct plasma that directly impacts the substrate in a processing chamber, wherein the direct plasma is generated first between a pedestal electrode and an ion filter and the remote plasma is generated between the ion filter and one or more of an ICP coil and a top electrode after the direct plasma is generated.

2. The processing method of claim 1, wherein exposing the substrate to the remote plasma and to the direct plasma cleans or treats the substrate.

3. The processing method of claim 1, further comprising exposing the substrate to at least one precursor to form a film on the substrate.

4. The processing method of claim 1, wherein the substrate comprises one or more of a trench, a via, or a peak.

5. The processing method of claim 4, wherein the substrate comprises one or more of a residue or a native oxide thereon.

* * * * *